United States Patent [19]

Tsuruoka et al.

[11] Patent Number: 5,898,276
[45] Date of Patent: Apr. 27, 1999

[54] ORGANIC ELECTROLUMINESCENT ELEMENT WITH UNIFORM DISPLAY SEGMENT VOLTAGES USING THE LINE RESISTANCES

[75] Inventors: Yoshihisa Tsuruoka; Hisamitsu Takahashi; Satoshi Tanaka; Toshio Miyauchi, all of Mobara, Japan

[73] Assignee: Futaba Denshi Kogyo K.K., Mobara, Japan

[21] Appl. No.: 08/864,374

[22] Filed: May 28, 1997

[30] Foreign Application Priority Data

Jun. 12, 1996 [JP] Japan .................................... 8-151264

[51] Int. Cl.⁶ ................................................... H05B 33/26
[52] U.S. Cl. ......................................... 315/169.3; 345/45
[58] Field of Search ....................... 315/169.3; 313/504, 313/510; 345/76, 77, 80, 45

[56] References Cited

U.S. PATENT DOCUMENTS 4,985,663  1/1991  Nakatani .............................. 315/169.3
5,445,711  8/1995  Tanski et al. ............................. 216/13
5,684,365  11/1997  Tang et al. ........................... 315/169.3

*Primary Examiner*—Robert Pascal
*Assistant Examiner*—Justin P. Bettendorf
*Attorney, Agent, or Firm*—Oblon, Spivak, McClelland, Maier & Neustadt, P.C.

[57] ABSTRACT

The voltage to be applied to fixed display segments are made to be substantially the same to prevent irregular luminance distribution so as to improve display quality. In consideration of allowable voltage drop occurring attributable to the levels of electric currents which flow in electric lines of fixed display segments, the same voltage is applied to the fixed display segments by determining the resistance values by changing the pattern shapes (the lengths, the widths, the thicknesses and the line) of electric lines of the fixed display segments. If the fixed display segments have the same display area, the widths of the electric lines of the fixed display segments are determined to correspond to the ratios of lengths of electric lines of the fixed display segments in order to cause the fixed display segments to be applied with the same voltage.

3 Claims, 3 Drawing Sheets

ORGANIC ELECTROLUMINESCENT ELEMENT WITH UNIFORM DISPLAY SEGMENT VOLTAGES USING THE LINE RESISTANCES

BACKGROUND OF THE INVENTION

1. Field of the Invention

The present invention relates to an organic electroluminescent element (hereinafter called an "organic EL") having a fixed display pattern realized by a plurality of fixed display segments each of which is composed of a laminate formed by sequentially laminating an anode, a hole transporting layer made of an organic compound, a luminescent layer made of an organic compound and a cathode.

2. Description of the Related Art

A portion of known organic EL has a so-called double-layer structure formed as shown in FIG. 3A such that two layers consisting of a luminescent layer 1 made of a thin organic fluorescent film and an organic hole transporting layer 2 are laminated between a metal electrode (for example, Mg:Ag or Al:Li) 3 serving a cathode and a transparent electrode 4 serving an anode. Another structure called as a triple-layer structure has been known in which an organic electron transporting layer 6 is, as shown in FIG. 3B, laminated in addition to the organic hole transporting layer 2 and the luminescent layer 6 of the above-mentioned double-layer structure.

Although the organic EL of the above-mentioned type is able to emit light having high luminance (for example, 1000 $cd/m^2$ or higher) even with low voltage (for example, 10 V or lower), an excessively high electric current flows such that an electric current of $1A/cm^2$ or higher sometimes instantaneously flows. Therefore, resistance raised in a portion of the wiring which reaches the light emitting portions for forming a display pattern enlarges a drop of the voltage. This leads to a fact that the light emitting portions cannot be applied with the same voltage and thus luminance becomes irregular.

As the material of the anode line, ITO (Indium-Titanium Oxide) has mainly been employed. The reason for this is that light permeability and a work function larger than 4.5 eV are required for the material to obtain a satisfactory hole injection efficiency. Although other materials, such as Au, Pt and Ni, are considered feasible to be employed, each of these materials requiring a small thickness to realize transparency involves an excessively raised sheet resistance. Therefore, ITO has been employed in actuality.

Since the resistance in the electric circuit is raised if ITO having high specific resistance is employed, a structure disclosed in Japanese Patent Laid-Open No. 6-5369 has been employed. That is, the organic EL of the foregoing type, as shown in FIG. 4A, has a light emitting portion composed of a transparent anode 23 and a metal cathode 24 forming a pair which holds a hole transporting layer 21 and a luminescent layer 22. Moreover, a light emitting portion formed at an intersection region in which the transparent electrode 23 and the metal cathode 24 are disposed opposite to each other, as one unit, forms one pixel so as to perform dot matrix display. A double-layer wiring structure is formed such that a metal film 25 having a smaller working function than that of the transparent anode 23 is laminated between the transparent anode 23 and the hole transporting layer 21 in order to weaken the overall resistance.

However, the organic EL disclosed in Japanese Patent Laid-Open No. 6-5369 has no contrivance for preventing change in the wiring resistance in each light emitting portion. A consideration can be performed that the irregular luminance distribution is prevented by employing a structure formed such that a constant current circuit 26 formed as shown in FIG. 4B is connected to each of the lines connected to the light emitting portions.

As described above, the structure of the organic EL disclosed in Japanese Patent Laid-Open No. 6-5369 requires the constant current circuit 26 to be connected to each line in order to prevent irregular luminance distribution among the light emitting portions occurring attributable to change in the wiring resistance. Thus, there arises a problem in that a large cost is required.

If the light emitting portion is formed into a fixed display segment as is employed in the fixed pattern display structure and thus the fixed display segments have individual display areas, the electric lines from the voltage supply terminals to the fixed display segments have different lengths. Therefore, since different electric currents flow in the fixed display segments even if the voltage supply terminals have the same potential, the electric lines encounter different amounts of voltage drops. Therefore, the light emitting portions encounter irregular luminance distribution.

To overcome the above-mentioned problem, the electric currents to be allowed to flow in the electric lines of the fixed display segments must be controlled. In this case, there arises a problem in that the structure of the circuit becomes too complicated. If a resistance correction element is provided for the inside portion of the drive circuit, the cost is raised in this case.

If the resistance is not corrected, a voltage drop of 1 V takes place in a case where voltage of 10 V is applied, an electric current level (the luminance) of 1 mA is required and the resistance raised from the electric line made of ITO is 1 kW. If the voltage drop of 1 V takes place, a difference in the luminance to an extent of hundreds of $cd/m^2$ takes place.

SUMMARY OF THE INVENTION

In view of the foregoing, an object of the present invention is to provide an organic EL arranged such that fixed display segments are applied with substantially the same voltage to prevent irregular luminance distribution in order to improve the display quality.

In order to achieve the above-mentioned object, according to one aspect of the present invention, there is provided an organic electroluminescent element comprising:

a plurality of fixed display segments each of which is formed by sequentially laminating an anode, a hole transporting layer made of an organic compound, a luminescent layer made of an organic compound and a cathode, wherein the resistance values of electric lines respectively connected from power supply terminals of the anode and cathodes to the fixed display segments are determined to correspond to electric currents which flow through the electric lines to cause the plural fixed display segments to be applied with substantially the same voltage.

The organic electroluminescent element according to the first embodiment may be structured such that the resistance value of the electric line is obtained by changing the shape of the pattern.

The organic electroluminescent element according to the first or second embodiment may be structured such that the electric lines are made of combinations of materials having different specific resistance values.

The organic EL according to the present invention is arranged to perform a required display by forming the structure such that allowable voltage drop occurring attributable to the level of the electric current which flows in each electric line of each fixed display segment is considered and the fixed display segments are applied with substantially the same voltage by determining resistance values by changing the patterns (the length, the width, the length and the like) of the electric lines of the fixed display segments. Moreover, the electric lines are made of materials having different specific resistance values, for example, combination of Al and ITO. The common electric line which is the major portion of the electric lines is made of Al. Moreover, ITO is employed between the common line and the fixed display segments. As a result, the wiring resistance can widely be selected and electric lines can easily be wired. Thus, an advantage can be realized when a dynamic drive structure is formed, the widths of the electric lines and shapes of the same of which are considerably limited.

Other objects, features and advantages of the invention will be evident from the following detailed description of the preferred embodiments described in conjunction with the attached drawings.

DETAILED DESCRIPTION OF THE
PREFERRED EMBODIMENTS

Figure 1:
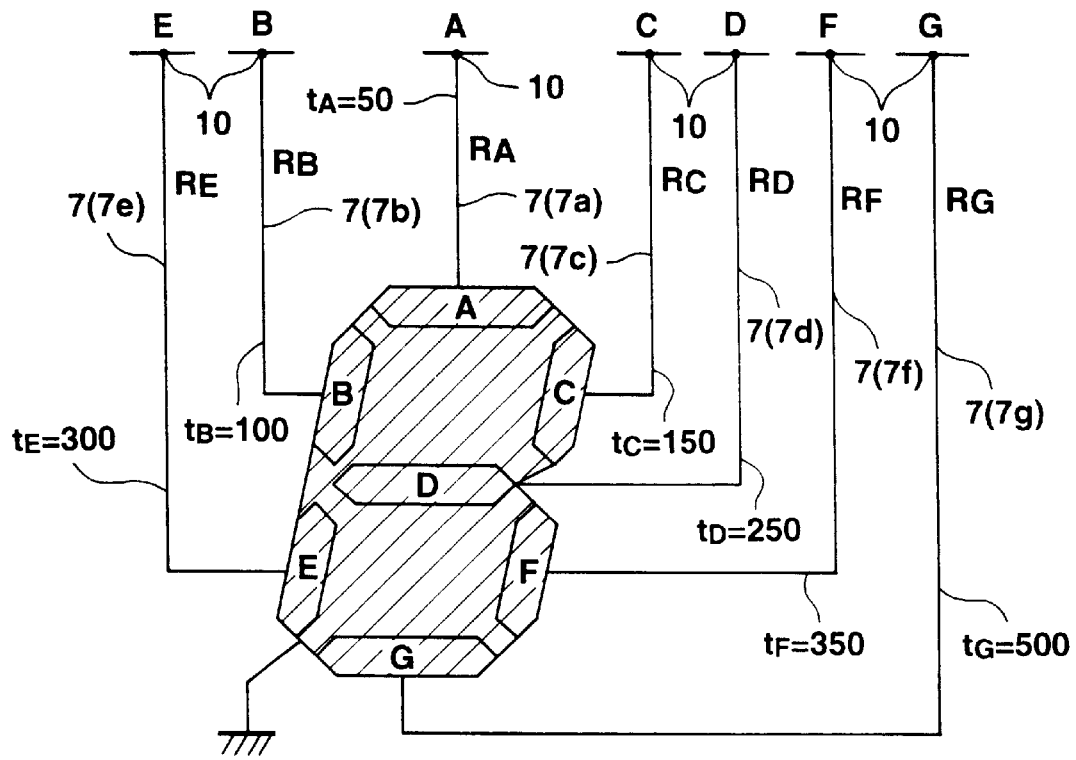
FIG. 1 is a diagram showing a first embodiment of an organic EL according to the present invention.

FIG. 1 is a diagram showing a first embodiment of an organic EL according to the present invention.

Figure 3A:
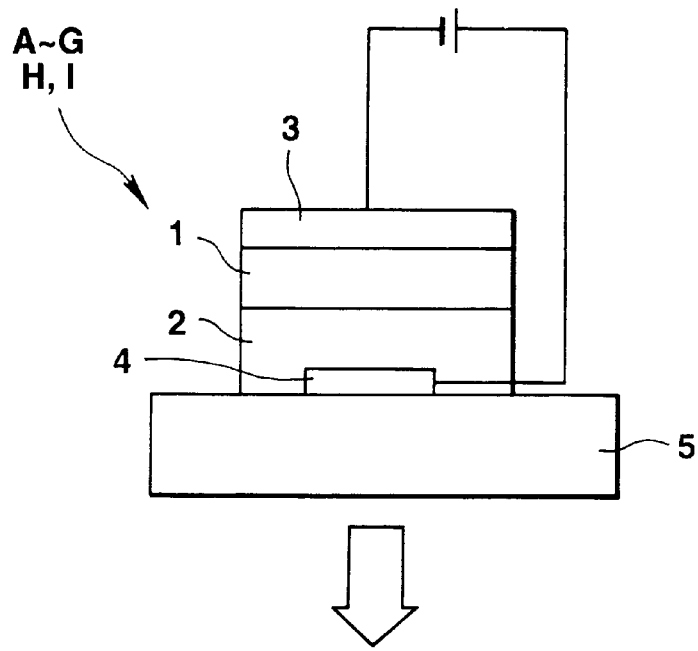
FIGS. 3A and 3B are cross sectional views showing a general structure of an organic EL.
Figure 3B:
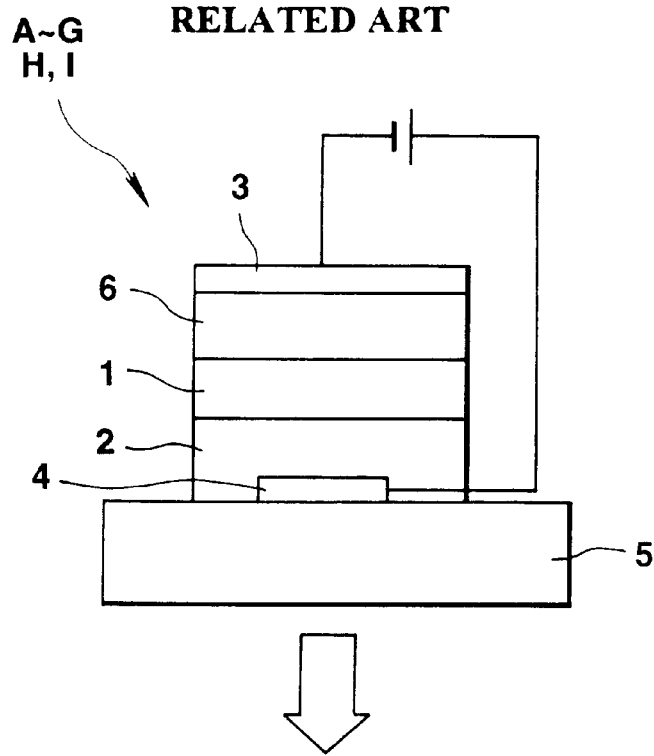
Figure 4A:
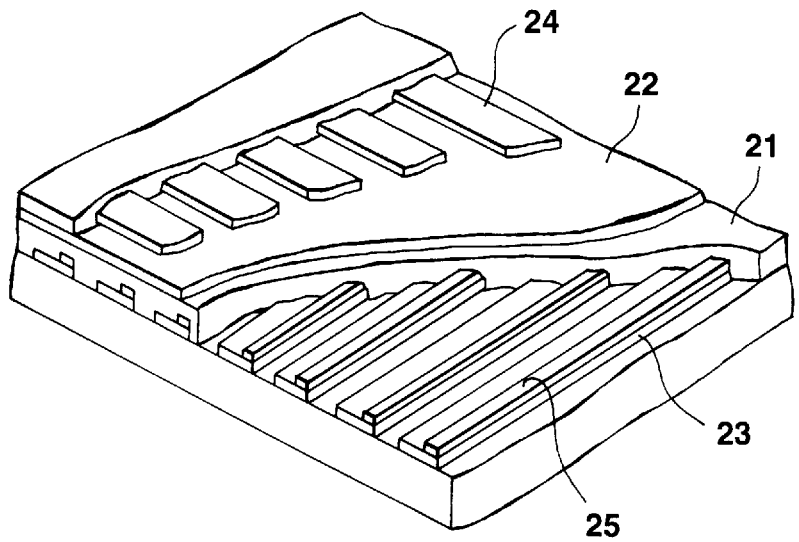
FIG. 4A is a partially cut perspective view schematically showing a conventional organic EL having a double-layer structure employed a matrix display structure.
Figure 4B:
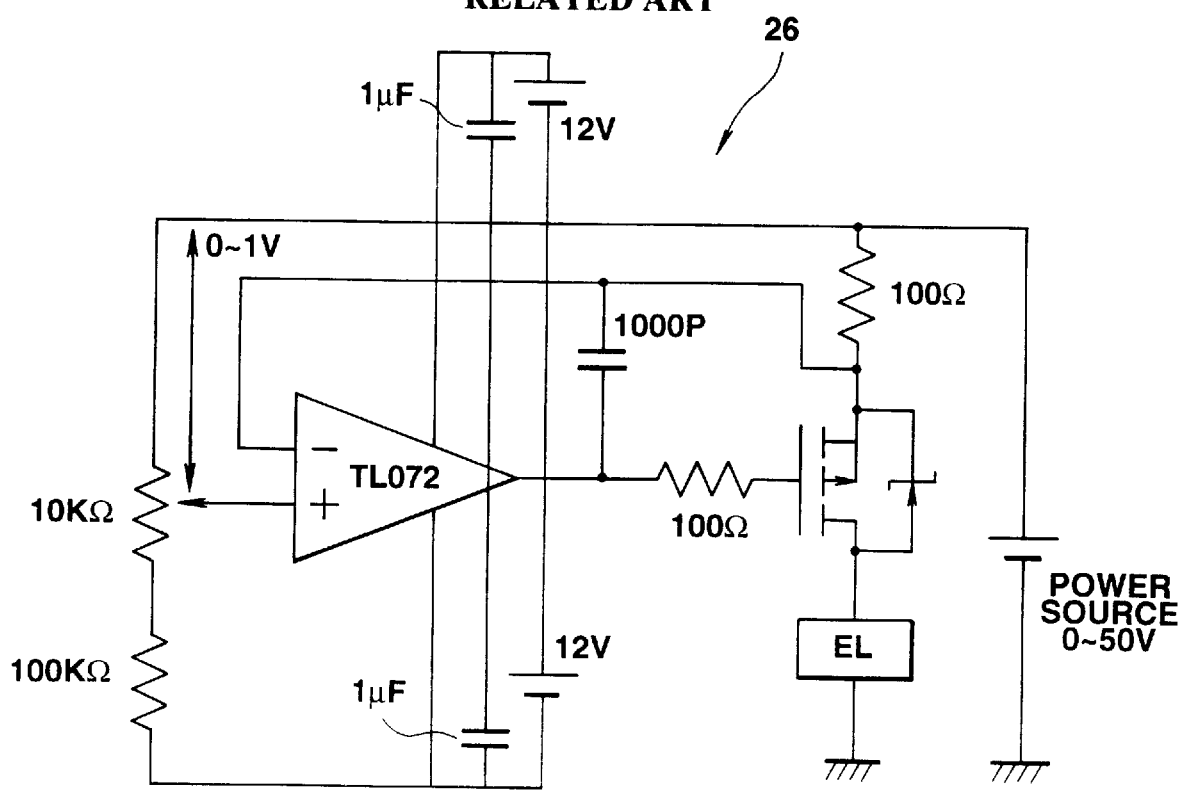
FIG. 4B is a diagram showing an example of the structure of a constant current circuit.

The organic EL according to the first embodiment has seven fixed display segments A, B, C, D, E, F and G having the same display area. Each of the fixed display segments A to G has a double-layer structure shown in FIG. 3 or a triple-layer structure shown in FIG. 4.

If the double-layer structure is employed, each of the fixed display segments A to G has a structure such that a luminescent layer 1 in the form of a thin organic fluorescent film and an organic hole transporting layer 2 are laminated between a metal electrode 3 serving as a cathode and a transparent electrode 4 serving as an anode. Moreover, the foregoing layers are sequentially laminated on a glass substrate 5 in such a manner that the glass substrate 5 is closely placed on the outer surface of the transparent electrode 4 serving the anode for each of the fixed display segments A to G.

If the triple-layer structure is employed, each of the fixed display segments A to G has a structure such that an organic electron transporting layer 6, a luminescent layer 1 and an organic hole transporting layer 2 are laminated between a metal electrode 3 serving as a cathode and a transparent electrode 4 serving as an anode. Moreover, a glass substrate 5 is closely placed on the outside of the transparent electrode 4 serving as the anode for each of the fixed display segments A to G.

When the metal electrode 3 serving as the cathode has a small working function and the transparent electrode 4 serving as the anode has a large working function, the electron injection efficiency is raised and the light emitting efficiency is improved. Specifically, metal such as aluminum, magnesium, indium, silver or their alloys having a small working function is employed as the metal electrode 3 serving as the cathode. The transparent electrode 4 serving as the anode is made of a conductive material, such as ITO or gold, having a large working function. When the anode is made of gold, the anode is formed into a semitransparent thin film.

The metal electrode 3 serving as the cathode of each of the fixed display segments A to G serves as a common electrode in this embodiment. On the other hand, the transparent electrode 4 serving as the anode is connected to a voltage supply terminal 10 through an electric line 7 (7a to 7g) having individual lengths for the fixed display segments A to G. Thus, a so-called static drive circuit structure is formed which is operated by one voltage supply source. Note that the metal electrode 3 serving as the cathode is formed not to overlap the electric circuit of the transparent electrode 4 serving as the anode.

The resistance values of the electric lines 7a to 7g arranged from the voltage supply terminal 10 to the fixed display segments A to G are corrected in such a manner that the same voltage (including an error about ±10%) is applied to the fixed display segments A to G in consideration of the allowable voltage drop occurring attributable to the level of the electric current (which is in proportion to the display area) which flows the electric lines 7a to 7g of the fixed display segments A to G.

Assuming that voltage to be supplied is V0 (V), allowable voltage drop is V1 (V) and anode currents which flow in the fixed display segments A to G are a (mA) to g (mA), resistance values required for the fixed display segments A to G can be expressed as follows:

RA ($\Omega$)=V1 (V)/a (mA)
RB ($\Omega$)=V1 (V)/b (mA)
RC ($\Omega$)=V1 (V)/c (mA)
RD ($\Omega$)=V1 (V)/d (mA)
RE ($\Omega$)=V1 (V)/e (mA)
RF ($\Omega$)=V1 (V)/f (mA)
RG ($\Omega$)=V1 (V)/g (mA)

In order to obtain the foregoing resistance values, the pattern shapes (the length, width, the thickness and the like) of the fixed display segments A to G are determined.

Since the display areas of the fixed display segments A to G which are in proportion to the anode currents are the same in the embodiment shown in FIG. 1, the widths of the electric lines 7a to 7g of the fixed display segments A to G are determined in accordance with the ratios of the lengths of the electric lines 7a to 7g of the fixed display segments A to G in such a manner that the same voltage is applied to the fixed display segments A to G.

Specifically, if the ratios of the lengths of the electric lines 7a to 7g of the fixed display segments A to G are A:B:C:D:E:F:G=1:2:3:5:6:7:10 with respect to the fixed display segment A, the widths of the electric lines 7a to 7g of the fixed display segments A to G are in proportion to the ratios of the lengths of the electric lines 7a to 7g because the fixed display segments A to G have the same display areas which are in proportion to the anode currents a to g.

Therefore, if the width tA of the electric line 7a of the fixed display segment A required to obtain resistance RA is set to be 50 $\mu$m, the widths tB to tG of the electric lines 7b to 7g of the fixed display segments B to G are set such that B=100 μm, C=150 μm, D=250 μm, E=300 μm, F=350 μm and G=500 μm. Thus, the fixed display segments A to G are applied with the same voltage through the corresponding electric lines 7a to 7g.

In the organic EL having the above-mentioned structure, when predetermined voltage is applied between the anode and the cathode of the predetermined fixed display segments from the voltage supply terminal 10 through the lines 7, excitons are generated attributable to recombination of electrons injected from the metal electrode 3 and holes injected from the transparent electrode 4. At this time, the fixed display segments are applied with the same voltage from the voltage supply terminal 10. Light emitted during deactivation of the excitons is allowed to pass through the transparent electrode 4 and the glass substrate 5, and then discharged to the outside. Thus, a display free from excessive irregularity of the luminance distribution is provided according to the present invention.

Although the above-mentioned embodiment has the structure such that display is performed by seven fixed display segments A to G, the shape and number of the fixed display segments A to G may arbitrarily be determined to be adaptable to a required state of display.

Figure 2:
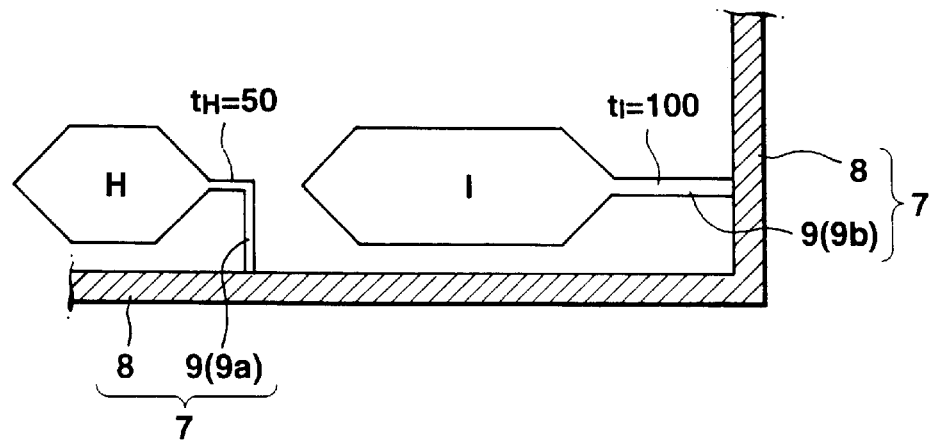
FIG. 2 is a diagram showing a second embodiment of the organic EL according to the present invention.

If the organic EL is composed of the plural fixed display segments A to G, the display areas realized by the fixed display segments A to G are usually different from one another. FIG. 2 shows a second embodiment of the organic EL structured in consideration of a case where the display areas realized by the fixed display segments are different from one another. Although the structure shown in FIG. 2 is formed such that two fixed display segments H and I having the display areas ratio 1:2 are provided, the shape and the number of the fixed display segments may be determined arbitrarily to be adaptable to a required display structure.

The organic EL according to the second embodiment has a structure such that electric lines 7 extending from the fixed display segments H and I arranged to have the display area ratio of 1:2 are made of materials having different specific resistance values. Specifically, the common electric line 8 which is the major portion of the electric line 7 connected to the voltage supply terminal is made of a material having a small specific resistance, for example, Al having a specific resistance of about $2.6 \times 10^{-6}$ Ω·cm. Connection lines 9 for establishing the connection between the fixed display segments H and I and the common electric line 8 are made of a material having a specific resistance larger than that of the material employed to make the common electric line 8, for example, ITO having a specific resistance of about $2 \times 10^{-4}$ Ω·cm which is larger than that of Al.

Since the wiring resistance can therefore widely be selected and the electric lines 7 can easily be wired, an advantage can be realized when a dynamic drive structure is formed which encounters considerable limits of the width of the electric line and the shape.

If the width tH of the connection line 9a of the fixed display segment H having a display area which is half the display area of the fixed display segment I is determined to be 50 μm in consideration of the resistance value of the common electric line 8 in a case where the connection resistors 9a and 9b of the corresponding fixed display segments H and I have the same lengths, the width tI of the connection line 9b of the fixed display segment I having a display area which is two times the display area of the fixed display segment H is determined to be 100 μm. As a result, the fixed display segments H and I are applied with the same voltage (including an error about ±10%) from the common electric line 8 through the corresponding connection lines 9.

FIG. 1 shows a circuit diagram employed when the fixed display segments A to G having the same display area are statically driven. When the fixed display segments A to G having the same display area are dynamically driven as shown in FIG. 2, the lengths and widths of the electric lines 7 from the fixed display segments A to G to the common electric line 8 are changed to determine the resistance values in order to cause the same voltage to be applied to the fixed display segments A to G.

FIG. 2 shows a structure of the connection employed when the fixed display segments H and I having different display areas are dynamically driven. When the fixed display segments H and I having different display areas are statically driven as shown in FIG. 1, the widths and thicknesses of the electric lines 7 are changed to correspond to the ratio of the display areas and that of the lengths of the electric lines so as to determine the resistance value in order to cause the same voltage to be applied to the fixed display segments H and I.

Although the above-mentioned embodiment has the structure such that the metal electrode 3 serving as the cathode is made to be the common electrode, the structure of the present invention may, of course, be applied to a structure in which the transparent electrode 4 serving as the anode is made to be a common electrode.

As described above, the present invention enables the fixed display segments forming the display portions to be applied with the same voltage. Thus, irregular luminance distribution can significantly be prevented so that the quality of display is improved. Moreover, the necessity for the conventional structure to provide a constant current circuit for each line of each fixed display segment can be eliminated when the device is structured. Therefore, the cost can be reduced. Since the electric lines are made of materials having different specific resistance values, the wiring resistance can widely be selected and the wiring can easily be performed.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. An organic electroluminescent element comprising:
   a plurality of fixed display segments each of which is formed by sequentially laminating an anode, a hole transporting layer made of an organic compound, a luminescent layer made of an organic compound and a cathode;
   wherein the resistance values of electric lines respectively connected from power supply terminals of said anode and cathodes to said fixed display segments are determined to correspond to electric currents which flow through said electric lines to cause the plural fixed display segments to be applied with substantially the same voltage.

2. The organic electroluminescent element fixed display according to claim 1, wherein said resistance values of said electric lines are obtained by changing one of the length, width and thickness thereof.

3. The organic electroluminescent element according to claim 1 or 2, wherein said electric lines are made of combinations of materials having different specific resistance values.

* * * * *